(12) United States Patent
Hong et al.

(10) Patent No.: US 11,664,212 B2
(45) Date of Patent: May 30, 2023

(54) SUBSTRATE TREATING APPARATUS AND LIQUID SUPPLYING METHOD

(71) Applicant: SEMES CO., LTD., Chungcheongnam-do (KR)

(72) Inventors: Yong Hoon Hong, Seoul (KR); Sul Lee, Chungcheongnam-do (KR); Myung A Jeon, Jeollanam-do (KR); Moonsik Choi, Seoul (KR); Young Su Kim, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 87 days.

(21) Appl. No.: 17/239,091

(22) Filed: Apr. 23, 2021

(65) Prior Publication Data

US 2021/0335596 A1   Oct. 28, 2021

(30) Foreign Application Priority Data

Apr. 24, 2020   (KR) ........................ 10-2020-0050040

(51) Int. Cl.
*H01L 21/02* (2006.01)
*H01L 21/263* (2006.01)

(52) U.S. Cl.
CPC .. *H01L 21/02057* (2013.01); *H01L 21/02282* (2013.01); *H01L 21/2636* (2013.01)

(58) Field of Classification Search
CPC ......... H01L 21/02057; H01L 21/02282; H01L 21/2636; H01L 21/67017; H01L 21/67248; H01L 21/67051; H01L 21/6715; H01L 21/6708; H01L 21/67103; B08B 3/02; B08B 13/00; B01D 35/02
See application file for complete search history.

(56) References Cited

U.S. PATENT DOCUMENTS

| 6,247,479 | B1 * | 6/2001 | Taniyama | ............... B08B 3/024 |
| | | | | 134/133 |
| 9,716,020 | B2 * | 7/2017 | Takaki | ............. H01L 21/67017 |
| 10,629,414 | B2 * | 4/2020 | Iwamoto | ................. H05G 2/00 |

(Continued)

FOREIGN PATENT DOCUMENTS

| CN | 102330126 B | * 10/2013 | ......... B01D 11/0203 |
| CN | 113921420 A | * 1/2022 | ......... B01D 11/0203 |

(Continued)

*Primary Examiner* — Mohammed Shamsuzzaman
(74) *Attorney, Agent, or Firm* — Procopio, Cory, Hargreaves & Savitch LLP

(57) ABSTRACT

The inventive concept provides a substrate treating apparatus. In an embodiment, the substrate treating apparatus includes a housing having a treatment space for treating a substrate in an interior thereof, a support unit that supports the substrate in the treatment space, a nozzle that supplies a liquid to the substrate positioned on the support unit, a liquid supply unit that supplies the liquid to the nozzle, and a controller that controls the liquid unit, the liquid supply unit includes a tank having an interior space for storing the liquid, and a first circulation line that circulates the liquid stored in the interior space and in which a first heater is installed, and the controller controls the first heater such that the first heater heats the liquid to a first temperature, at which particles in the interior of the liquid are not eluted.

12 Claims, 7 Drawing Sheets

(56) References Cited

U.S. PATENT DOCUMENTS

| | | | |
|---|---|---|---|
| 2015/0348805 A1* | 12/2015 | Kim | H01L 21/67017 |
| | | | 156/345.18 |
| 2016/0035597 A1* | 2/2016 | Hinode | H01L 21/6708 |
| | | | 216/84 |
| 2022/0208568 A1* | 6/2022 | Ha | H01L 21/67103 |

FOREIGN PATENT DOCUMENTS

| | | | | |
|---|---|---|---|---|
| JP | 2008171956 A | | 7/2008 | |
| JP | 2012153934 A | | 8/2012 | |
| JP | 2012204746 A | | 10/2012 | |
| JP | 2013007099 A | | 1/2013 | |
| JP | 2014082513 A | | 5/2014 | |
| JP | 2017175166 A | | 9/2017 | |
| JP | 2019012856 A | * | 1/2019 | ......... B01D 11/0203 |
| JP | 2020047857 A | | 3/2020 | |
| KR | 1020160038786 A | | 4/2016 | |
| KR | 10-2019-0019007 A | | 2/2019 | |
| KR | 10-2019-0046691 A | | 5/2019 | |
| WO | 2010/104206 A1 | | 9/2010 | |

* cited by examiner

SUBSTRATE TREATING APPARATUS AND LIQUID SUPPLYING METHOD

CROSS-REFERENCE TO RELATED APPLICATIONS

A claim for priority under 35 U.S.C. § 119 is made to Korean Patent Application No. 10-2020-0050040 filed on Apr. 24, 2020, in the Korean Intellectual Property Office, the entire contents of which are hereby incorporated by reference.

BACKGROUND

The inventive concept relates to a substrate treating apparatus for supplying a liquid to a substrate, and a liquid supplying method.

Contaminants such as particles, organic contaminants, and metallic contaminants on a surface of a substrate greatly influence the characteristics and yield rate of a semiconductor device.

Due to this, a cleaning process of removing various contaminants attached to a surface of a substrate is very important, and a process of cleaning a substrate is performed before and after unit processes for manufacturing a semiconductor.

In general, a process of cleaning a substrate includes a chemical treating process of removing metallic substances, organic substances, and particles residing on a substrate by using a treatment liquid such as a chemical, a rinsing process of removing the chemical residing on the substrate by using pure water, and a drying process of drying the substrate by using a nitrogen gas.

In a treatment process of supplying a treatment liquid such as a chemical or a rinsing liquid onto a substrate, the liquid supply unit provides the treatment liquid to a nozzle unit. In general, the liquid supply unit includes a tank that stores the treatment liquid, a supply line that provides the treatment liquid from the interior space of the tank to the nozzle unit, and a recovery line that recovers the treatment liquid to the interior space of the tank after the substrate is treated.

However, when the treatment liquid is heated to a process temperature to treat the substrate with the treatment liquid, particles are generated in a pipeline, a heater, a valve, and the like when the temperature of the liquid is a specific temperature or higher. The particles generated in the pipeline or the like float in the interior of the treatment liquid. A filter is provided in the supply line or the like to filter out the particles that float in the interior of the treatment liquid before they are supplied to the nozzle. However, as the particles continuously generated, the particles are accumulated in the filter to shorten the life span of the filter and a pressure loss is caused in the pipeline.

As the particles in the interior of the treatment liquid are generated under a high-temperature environment such as an inner wall of the pipeline, as the distance between the heater that heats the treatment liquid and the nozzle that supplies the treatment liquid into the substrate becomes longer, a larger amount of particles are generated in the pipeline.

SUMMARY

Embodiments of the inventive concept provide a substrate treating apparatus that minimizes generation of particles in a liquid supply unit, and a liquid supplying method.

Embodiments of the inventive concept also provide a substrate treating apparatus that increases the life span of a filter provided in a liquid supply unit, and a liquid supplying method.

Embodiments of the inventive concept also provide a substrate treating apparatus that minimizes the pressure loss of a liquid provided to as a to-be-treated material in a liquid supply unit, and a liquid supplying method.

The problems that are to be solved by the inventive concept are not limited to the above-mentioned problems, and the unmentioned problems will be clearly understood by those skilled in the art to which the inventive concept pertains from the specification and the accompanying drawings.

The inventive concept provides a substrate treating apparatus. The substrate treating apparatus includes a housing having a treatment space for treating a substrate in an interior thereof, a support unit that supports the substrate in the treatment space, a nozzle that supplies a liquid to the substrate positioned on the support unit, a liquid supply unit that supplies the liquid to the nozzle, and a controller that controls the liquid unit, wherein the liquid supply unit includes a tank having an interior space for storing the liquid, and a first circulation line that circulates the liquid stored in the interior space and in which a first heater is installed, an outlet line that is branched from the first circulation line to supply the liquid to the nozzle, and a recovery line that is branched from the outlet line to recover the liquid to the interior space of the tank, and wherein the controller controls the first heater such that the first heater heats the liquid to a first temperature, at which particles in the interior of the liquid are not eluted.

In an embodiment, a first filter may be installed in the first circulation line on a downstream side of the first heater to be adjacent to the first heater.

In an embodiment, the liquid supply unit may further include a second circulation line in which a first filter is installed at a branch point branched from the first circulation line and which circulates the liquid stored in the interior space.

In an embodiment, the outlet line may include a heating part provided adjacent to the nozzle and in which a second heater is installed, the controller may control the second heater such that the second heater heats the liquid to a second temperature, at which the liquid treats the substrate, and the second temperature may be higher than the first temperature.

In an embodiment, a second filter may be installed in the heating part on a downstream side of the second heater to be adjacent to the second heater.

In an embodiment, the heating part may include a pipeline, through which the liquid flows, and a tube surrounding the pipeline and in which a heating liquid flows in an interior thereof, and the second heater may be configured to heat the heating liquid.

In an embodiment, the pipeline may include a first side part provided at one end of the heating part, a second side part provided at an opposite end of the heating part, and a plurality of connection pipes connecting the first side part and the second side part, and diameters of the connection pipes are smaller than diameters of the first side part and the second side part.

In an embodiment, the second heater may be configured to heat the heating liquid to a third temperature, and the third temperature may be higher than the second temperature.

In an embodiment, a substrate treating apparatus may include a housing having a treatment space for treating a substrate in an interior thereof, a support unit that supports the substrate in the treatment space, a nozzle that supplies a liquid to the substrate positioned on the support unit, and a liquid supply unit that supplies the liquid to the nozzle, and a controller that controls the liquid supply unit, wherein the liquid supply unit includes a tank having an interior space for storing the liquid, and a first circulation line that circulates the liquid stored in the interior space and in which a first heater is installed, an outlet line branched from the first circulation line to supply the liquid to the nozzle, and a recovery line that is branched from the outlet line to recover the liquid to an interior space of the tank, wherein the outlet line includes a heating part provided adjacent to the nozzle and in which a second heater is installed, wherein the controller controls the first heater and the second heater such that the first heater heats the liquid to a first temperature and the second heater heats the liquid to a second temperature, and wherein the second temperature is higher than the first temperature.

In an embodiment, the first temperature may be a room temperature to 70° C.

In an embodiment, the second temperature may be 70° C. to 90° C.

In an embodiment, a first filter may be installed in the outlet line on a downstream side of the first heater to be adjacent to the first heater.

In an embodiment, a second filter may be installed in the heating part on a downstream side of the second heater to be adjacent to the second heater.

In an embodiment, the heating part may include a pipeline, through which the liquid flows, and a tube surrounding the pipeline and in which a heating liquid flows in an interior thereof, and the second heater may be configured to heat the heating liquid.

In an embodiment, the pipeline may include a first side part provided at one end of the heating part, a second side part provided at an opposite end of the heating part, and a plurality of connection pipes connecting the first side part and the second side part, and diameters of the connection pipes are smaller than diameters of the first side part and the second side part.

In an embodiment, the second heater may heat the heating liquid to a third temperature, and the third temperature may be higher than the second temperature.

In an embodiment, the liquid may be isopropyl alcohol (IPA).

The inventive concept provides a liquid supplying method. The liquid supplying method includes a circulation operation of circulating a liquid at a first temperature before the liquid is supplied to a nozzle, and a supply operation of supplying the liquid to the nozzle after the circulation operation, wherein, in the circulation operation, the liquid is heated to the first temperature, at which the particles in the interior of the liquid are not eluted.

In an embodiment, in the supply operation, the liquid may be heated to a second temperature, and the second temperature may be higher than the first temperature.

In an embodiment, the second temperature may be a process temperature for treating the substrate with the liquid.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Figure 1:
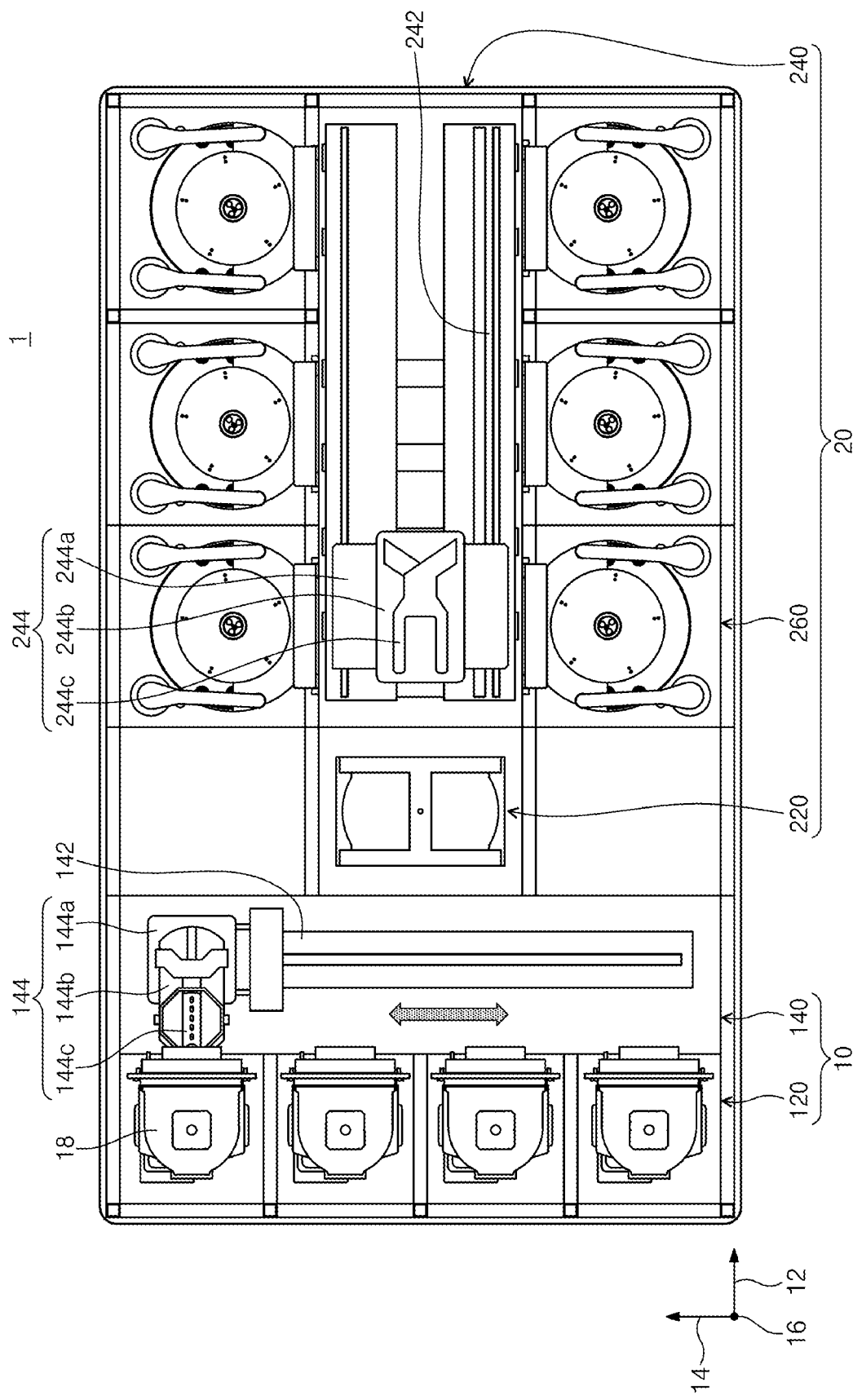
FIG. 1 is a front view schematically illustrating an example of a substrate treating facility provided with a substrate treating apparatus according to an embodiment of the inventive concept.

FIG. 1 is a plan view schematically illustrating a substrate treating system 1 according to the inventive concept. Referring to FIG. 1, the substrate treating system 1 has an index module 10 and a process treating module 20, and the index module 10 has a plurality of load ports 120 and a feeding frame 140. The load ports 120, the feeding frame 140, and the process treating module 20 may be sequentially arranged in a row. Hereinafter, a direction, in which the load port 120, the feeding frame 140, and the process treating module 20 are arranged, will be referred to a first direction 12. A direction that is perpendicular to the first direction 12 when viewed from the top will be referred to as a second direction 14, and a direction that is normal to a plane including the first direction 12 and the second direction 14 will be referred to as a third direction 16.

A carrier 130, in which a substrate W is received, is seated on the load port 120. A plurality of load ports 120 are provided, and are disposed along the second direction 14 in a row. FIG. 1 illustrates that four load ports 120 are provided. However, the number of the load ports 120 may increase or decrease according to a condition, such as the process efficiency and the footprint of the process treating module 20. A plurality of slots (not illustrated) configured to support peripheries of substrates are formed in the carrier 130. A plurality of slots are provided along the third direction 16, and the substrate are situated in the carrier 130 such that the substrates are stacked to be spaced apart from each other along the third direction 16. A front opening unified pod (FOUP) may be used as the carrier 130.

The process treating module 20 has a buffer unit 220, a feeding chamber 240, and a plurality of process chambers 260. The feeding chamber 240 is disposed such that the lengthwise direction thereof is in parallel to the first direction 12. The process chambers 260 are arranged on opposite sides of the feeding chamber 240 along the second direction 14. The process chambers 260 situated on one side of the feeding chamber 240 and the process chambers 260 situated on an opposite side of the feeding chamber 240 are symmetrical to each other with respect to the feeding chamber 240. Some of the process chambers 260 are arranged along the lengthwise direction of the feeding chamber 240. Furthermore, some of the process chambers 260 are arranged to be stacked on each other. That is, the process chambers 260 having an array of A by B (A and B are natural numbers that are not less than one) may be arranged on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may increase or decrease. Unlike the above-mentioned description, the process chambers 260 may be provided only on one side of the feeding chamber 240. Furthermore, unlike the above-mentioned description, the process chambers 260 may be provided on one side or opposite sides of the feeding chamber 240 to form a single layer.

The buffer unit 220 is arranged between the feeding frame 140 and the feeding chamber 240. The buffer unit 220 provides a space, in which the substrates W stay before being transported, between the feeding chamber 240 and the feeding frame 140. Slots (not illustrated), in which the substrates W are positioned, are provided in the buffer unit 220, and a plurality of slots (not illustrated) are provided to be spaced apart from each other along the third direction 16. A surface of the buffer unit 220, which faces the feeding frame 140, and a surface of the buffer unit 220, which faces the feeding chamber 240, are opened, respectively.

The feeding frame 140 transports the substrates W between the carrier 130 seated on the load port 120 and the buffer unit 220. An index rail 142 and an index robot 144 are provided in the feeding frame 140. The index rail 142 is provided such that the lengthwise direction thereof is in parallel to the second direction 14. The index robot 144 is installed on the index rail 142, and is linearly moved in the second direction 14 along the index rail 142.

The index robot 144 has a base 144a, a body 144b, and a plurality of index arms 144c. The base 144a is installed to be moved along the index rail 142. The body 144b is coupled to the base 144a. The body 144b is configured to be moved along the third direction 16 on the base 144a. The body 144b is configured to be rotated on the base 144a. The index arms 144c are coupled to the body 144b, and are configured to be moved forwards and rearwards with respect to the body 144b. A plurality of index arms 144c are configured to be driven individually. The index arms 144c are arranged to be stacked so as to be spaced apart from each other along the third direction 16. Some of the index arms 144c may be used when the substrates W are transported to the carrier 130 in the process treating module 20, and some of the index arms 144c may be used when the substrates W are transported from the carrier 130 to the process treating module 20. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260, and between the process chambers 260. A guide rail 242 and a main robot 244 are provided in the feeding chamber 240.

The guide rail 242 is arranged such that the lengthwise direction thereof is in parallel to the first direction 12. The main robot 244 is installed on the guide rail 242, and is linearly moved along the first direction 12 on the guide rail 242. The main robot 244 has a base 244a, a body 244b, and a plurality of main arms 244c. The base 244a is installed to be moved along the guide rail 242. The body 244b is coupled to the base 244a. The body 244b is configured to be moved along the third direction 16 on the base 244a. The body 244b is configured to be rotated on the base 244a. The main arms 244c are coupled to the body 244b, and are configured to be moved forwards and rearwards with respect to the body 244b. A plurality of main arms 244c are provided and are configured to be driven individually. The main arms 244c are arranged to be stacked so as to be spaced apart from each other along the third direction 16. The main arms 244c that are used when the substrates are transported from the buffer unit 220 to the process chambers 260 and the main arms 244c that are used when the substrates are transported from the process chambers 260 to the buffer unit 220 may be different.

Substrate treating apparatuses 300 that perform cleaning processes on the substrates W are provided in the process chambers 260. The substrate treating apparatuses 300 provided in the process chambers 260 may have different structures according to the types of the cleaning processes. Optionally, the substrate treating apparatuses 300 in the process chambers 260 may have the same structure. Optionally, the process chambers 260 may be classified into a plurality of groups such that the structures of the substrate treating apparatuses 300 in the process chambers 260 pertaining to the same group are the same and the structures of the substrate treating apparatuses 300 in the process chambers 260 pertaining to different groups are different.

For example, when the process chambers 260 are classified into two groups, the first group of process chambers 260 may be provided on one side of the feeding chamber 240 and the second group of process chambers 260 may be provided on an opposite side of the feeding chamber 240. Optionally, the first group of process chambers 260 may be provided on the lower side of the feeding chamber 240 and the second group of process chambers 260 may be provided on the upper side of the feeding chamber 240, on opposite sides of the feeding chamber 240, respectively. The first group of process chambers 260 and the second group of process chambers 260 may be classified according to the types of the used liquids or the types of cleaning schemes.

Figure 2:
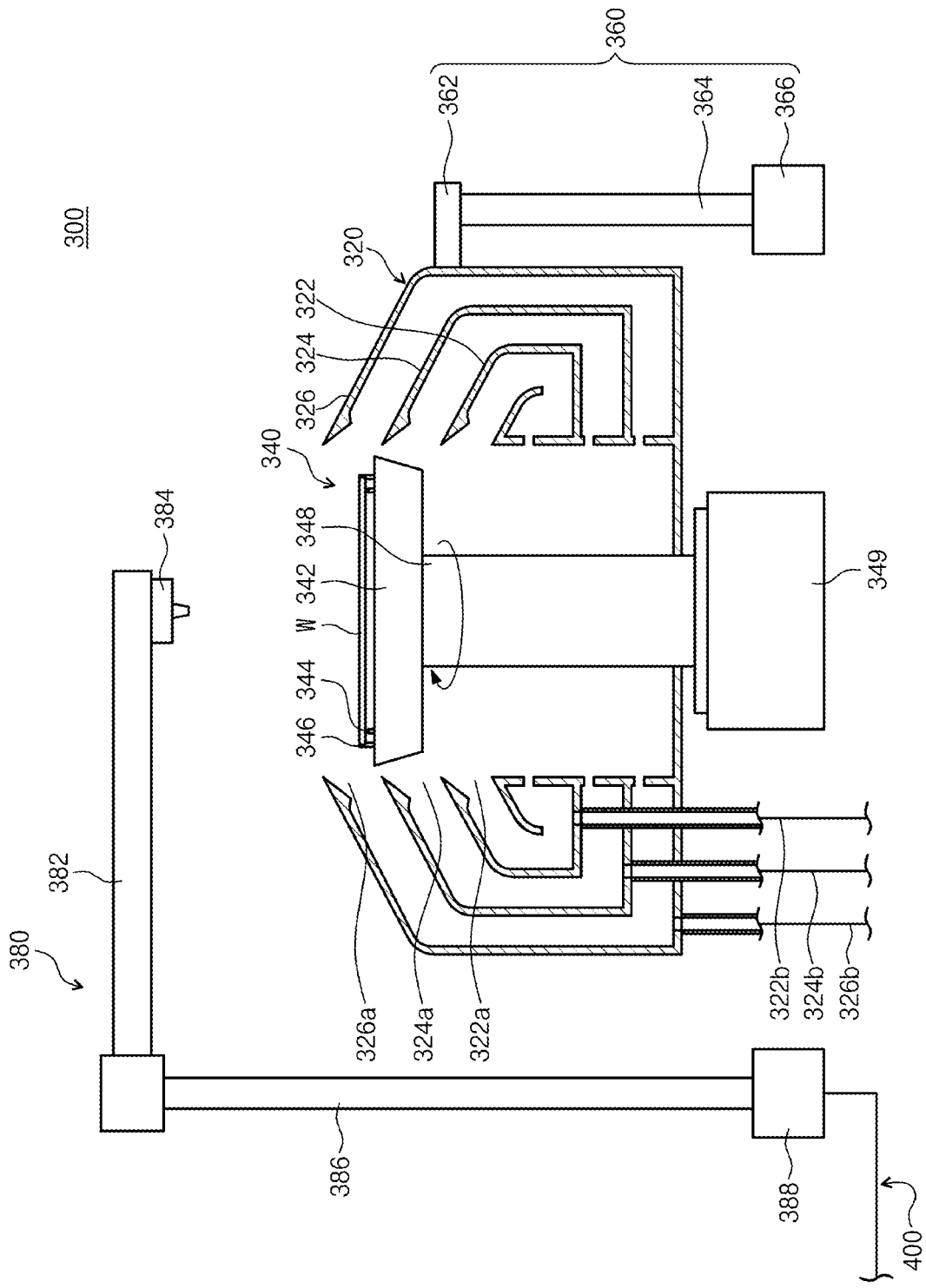
FIG. 2 is a cross-sectional view illustrating an example of a substrate treating apparatus provided in a process chamber of FIG. 1.

Hereinafter, an example of the substrate treating apparatus 300 that cleans a substrate W by using a treatment liquid will be described. FIG. 2 is a cross-sectional view illustrating an example of the substrate treating apparatus 300. Referring to FIG. 2, the substrate treating apparatus 300 includes a housing 320, a support unit 340, an elevation unit 360, a nozzle unit 380, and a liquid supply unit 400.

The housing 320 provides a space for performing a substrate treating process, and an upper side of the housing 320 is opened. The housing 320 has an inner recovery vessel 322, an intermediate recovery vessel 324, and an outer recovery vessel 326. The recovery vessels 322, 324, and 326 recover different treatment liquids used in the process. The inner recovery vessel 322 has an annular ring shape that surrounds the support unit 340, the intermediate recovery vessel 324 has an annular ring shape that surrounds the inner recovery vessel 322, and the outer recovery vessel 326 has an annular ring shape that surrounds the intermediate recovery vessel 324. An inner space 322a of the inner recovery vessel 322, a space 324a between the inner recovery vessel 322 and the intermediate recovery vessel 324, and a space 326a between the intermediate recovery vessel 324 and the outer recovery vessel 326 function as inlets, through which the treatment liquids are introduced into the inner recovery vessel 322, the intermediate recovery vessel 324, and the outer recovery vessel 326, respectively. Recovery lines 322b, 324b, and 326b extending from the recovery vessels 322, 324, and 326 perpendicularly in the downward direction of the bottom surfaces thereof are connected to the recovery vessels 322, 324, and 326, respectively. The recovery lines 322b, 324b, and 326b discharge the treatment liquids introduced through the recovery vessels 322, 324, and 326, respectively. The discharged treatment liquids may be reused through an external treatment liquid recycle system (not illustrated).

The support unit 340 is arranged in the housing 320. The support unit 340 supports and rotates the substrate during the process. The support unit 340 includes a body 342, a plurality of support pins 334, a plurality of chuck pins 346, and a support shaft 348. The body 342 has an upper surface that has a substantially circular shape when viewed from the top. The support shaft 348 that may be rotated by a motor 349 is fixedly coupled to the bottom of the body 342. The plurality of support pins 334 are provided. The support pins 334 may be arranged to be spaced apart from each other at a periphery of the upper surface of the body 342 and protrude upwards from the body 342. The support pins 334 are arranged to have a shape that are annular ring-shaped as a whole through combination thereof. The support pins 334 support a periphery of a rear surface of the substrate W such that the substrate W is spaced apart from the upper surface of the body 342 by a specific distance. The plurality of chuck pins 346 are provided. The chuck pins 346 are arranged to be more distant from the center of the body 342 than the support pins 334. The chuck pins 346 are configured to protrude upwards from the body 342. The chuck pins 346 support a side of the substrate such that the substrate is prevented from being separated laterally from a proper place when the support unit 340 is rotated. The chuck pins 346 are configured to be linearly moved between a standby position and a support position along a radial direction of the body 342. The standby position is a position that is more distant from the center of the body 342 than the support position. When the substrate W is loaded on or unloaded from the support unit 340, the chuck pins 346 are situated at the standby position, and when a process is performed on the substrate W, the chuck pins 346 are situated at the support position. The chuck pins 346 are in contact with the side of the substrate at the support position.

The elevation unit 360 linearly moves the housing 320 upwards and downwards. When the housing 320 moves upwards and downwards, a relative height of the housing 320 to the support unit 340 is changed. The elevation unit 360 has a bracket 362, a movable shaft 364, and a driver 366. The bracket 362 is fixedly installed on an outer wall of the housing 320, and the movable shaft 364 that moves upwards and downwards by the driver 366 is fixedly coupled to the bracket 362. The housing 320 is lowered such that, when the substrate W is positioned on the support unit 340 or is lifted from the support unit 340, the support unit 340 protrudes to the upper side of the housing 320. When the process is performed, the height of the housing 320 is adjusted such that the treatment liquid are introduced into the preset recovery vessel 326 according to the type of the treatment liquid supplied to the substrate W. For example, the substrate is situated at a height corresponding to the inner space 322a of the inner recovery vessel 322 while the substrate is treated by a first treatment liquid. Furthermore, the substrate may be situated at a height corresponding to the space 324a between the inner recovery vessel 322 and the intermediate recovery vessel 324 and the space 326a between the intermediate recovery vessel 324 and the outer recovery vessel 326 while the substrate is treated by a second treatment liquid and a third treatment liquid, respectively. Unlike those described above, the elevation unit 360 may move the support unit 340, instead of the housing 320, upwards and downwards.

The nozzle unit 380 supplies a treatment liquid to the substrate W during a substrate treating process. The nozzle unit 380 has a nozzle support 382, a nozzle 384, a support shaft 386, and a driver 388. The lengthwise direction of the support shaft 386 is provided along the third direction 16, and the driver 388 is coupled to a lower end of the support shaft 386. The driver 388 rotates and elevates the support shaft 386. The nozzle support 382 is coupled to an end of the support shaft 386, which is opposite to an end of the support shaft 386 coupled to the driver 388, perpendicularly to the support shaft 386. The nozzle 384 is installed on a bottom surface of an end of the nozzle support 382. The nozzle 384 is moved to a process location and a standby location by the driver 388. The process location is a location, at which the nozzle 384 is arranged at a vertical upper portion of the housing 320, and the standby location is a location that deviates from the vertical upper portion of the housing 320. One or a plurality of nozzle units 380 may be provided. When a plurality of nozzle units 380 are provided, a liquid, a rinsing liquid, or an organic solvent may be provided through different nozzle units 380. The rinsing liquid may be pure water, and the organic solvent may be a mixture of isopropyl alcohol vapor and an inert gas or an isopropyl alcohol liquid. The liquid supply unit 400 supplies the liquid to the nozzle unit 380. In an example, the liquid supply unit 400 supplies the organic solvent to the nozzle unit 380. For example, the organic solvent may be isopropyl alcohol (IPA).

Figure 3:
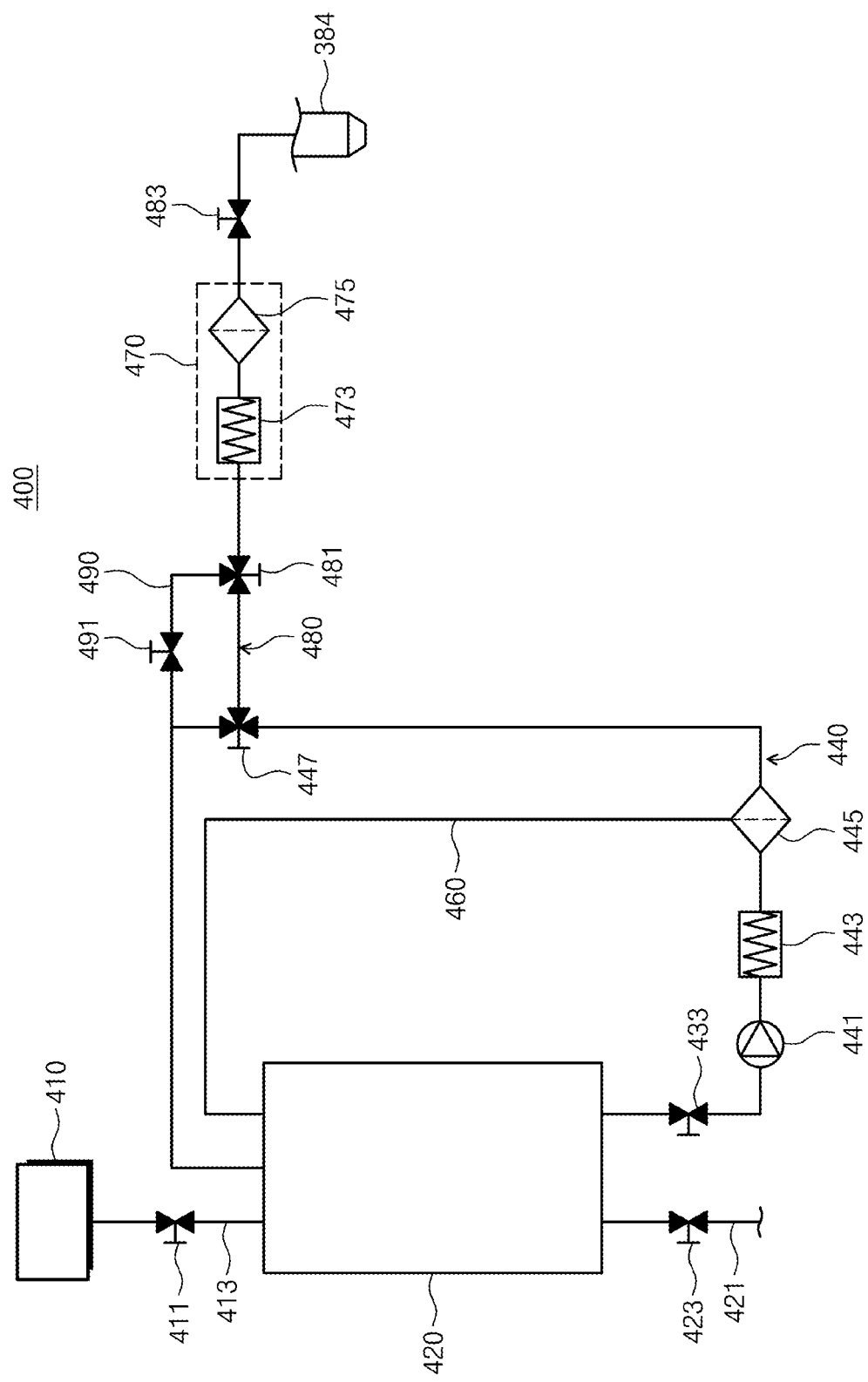
FIG. 3 is a view schematically illustrating a state of a liquid supply unit according to an embodiment of the inventive concept.

FIG. 3 is a view schematically illustrating a state of the liquid supply unit 400 according to an embodiment of the inventive concept. Referring to FIG. 3, the liquid supply unit 400 includes a liquid supply source 410, a tank 420, an inlet line 413, a drain line 421, a first circulation line 440, a second circulation line 460, an outlet line 480, and a recovery line 490.

The liquid supply source 410 stores a liquid used in a process, and supplies the liquid to the tank 420. The liquid is stored in an interior space of the tank 420. In an example, a sensor (not illustrated) is mounted in the interior of the tank 420. The sensor (not illustrated) detects the residual amount of the liquid stored in the interior space of the tank. The inlet line 413 connects the liquid supply source 410 to the tank 420. An inlet valve 411 is installed in the inlet line 413 to adjust the flow rate of the liquid supplied from the liquid supply source 410 to the tank 420.

The drain line 421 drains the water from the tank 420. A drain valve 423 is installed in the drain line 421 to adjust the flow rate of the liquid discharged from the tank 420.

The first circulation line 440 circulates the liquid stored in the interior space of the tank 420. A first circulation valve 433, a pump 441, a first heater 443, and a first filter 445 are installed in the first circulation line 440. The first circulation valve 433 adjusts the flow rate of the liquid provided from the interior space of the tank 420 to the pump 441. The pump 441 adjusts the flow rate of the supplied liquid by controlling the strokes per minute of the liquid provided to the first heater 443.

The first heater 443 heats the liquid that circulates in the first circulation line 440. The first filter 445 is provided on a downstream side of the first heater 443 to be adjacent to the first heater 443. The first filter 445 filters out particles that float in the interior of the pipeline provided in the first circulation line 440. In an example, the first filter 445 is provided on a downstream side of the first heater 443 and the pump 441 to filter out particles generated in the interior of the first heater 443 or the pump 441.

The second circulation line 460 is branched from the first circulation line 440. In an example, the first filter 445 is installed at a branch point of the first circulation line 440 and the second circulation line 460. The second circulation line 460 removes bubbles generated in the first circulation line 440 with the first filter 445 or the like.

The outlet line 480 is branched from the first circulation line 440 to supply the liquid to the nozzle 384. A second circulation valve 447 is provided at a branch point of the outlet line 480 and the first circulation line 440. In an example, a 3-way valve is provided as the second circulation valve 447. The second circulation valve 447 adjusts the direction of the liquid and the flow rate of the liquid at the branch point of the outlet line 480 and the first circulation line 440. A heating part 470 and a supply valve 483 are installed in the outlet line 480.

The recovery line 490 is branched from the outlet line 480 to recover the liquid to the interior space of the tank 420. An outlet valve 481 is installed in the recovery line 490. The outlet valve 481 is provided at the branch point of the recovery line 490 and the outlet line 480. In an example, a 3-way valve is provided as the outlet valve 481. The outlet valve 481 adjusts the direction of the liquid and the flow amount of the liquid at the branch point of the recovery line 490 and the outlet line 480.

Figure 4:
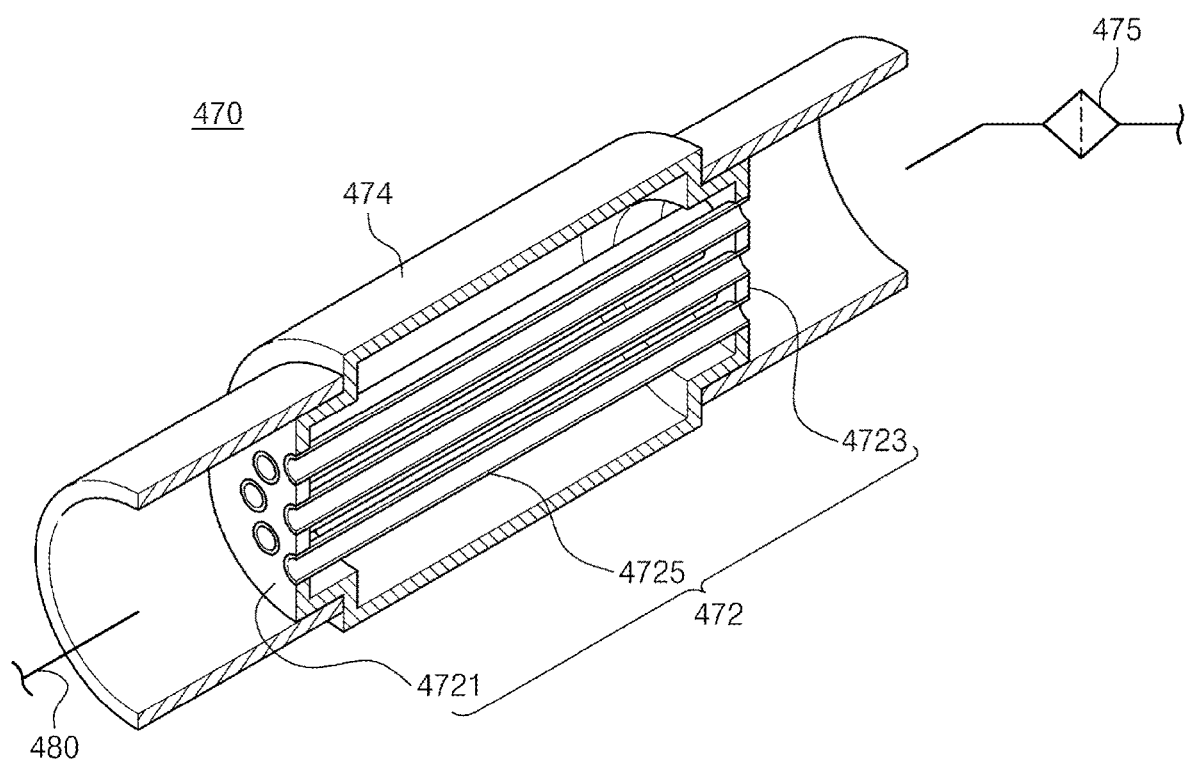
FIGS. 4 and 5 are cross-sectional views illustrating a state of a heating part according to an embodiment of the inventive concept.
Figure 5:
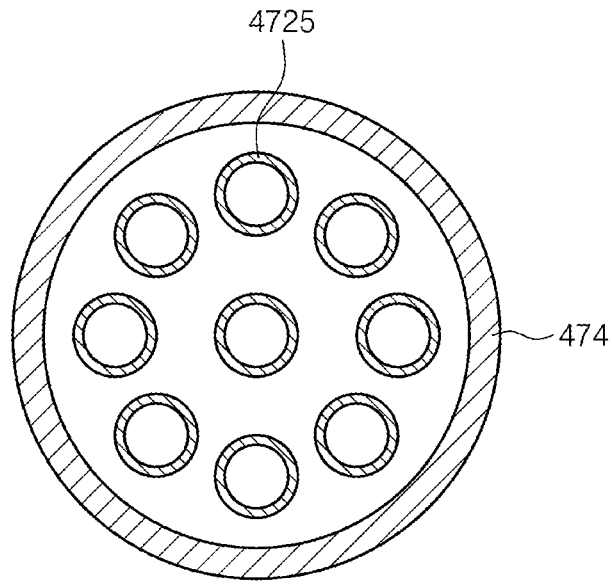

Hereinafter, the heating part 470 will be described with reference to FIGS. 4 and 5. FIGS. 4 and 5 are cross-sectional views illustrating a state of a heating part 470 according to an embodiment of the inventive concept. Referring to FIGS. 4 and 5, the heating part 470 includes a second heater 473 and a second filter 475.

The second filter 475 is provided on a downstream side of the second heater 473 to be adjacent to the second heater 473. The heating part 470 includes a pipeline 472 and a tube 474. A liquid flows in the interior of the pipeline 472. In an example, the pipeline 472 includes a first side part 4721 provided at one end of the heating part 470, a second side part 4723 provided at an opposite end of the heating part 470, and a plurality of connection pipes 4725 connecting the first side part 4721 and the second side part 4723. The diameter of the connection pipe 4725 may be smaller than the diameters of the first side part 4721 and the second side part 4723. In an example, eight connection pipes 4725 may be provided.

The tube 474 is configured to surround the pipeline 472 and a heating liquid flows in the interior of the tube 474. In an example, the heating liquid may be deionized water. In an example, the second heater 473 is configured to heat the heating liquid. The heating liquid heats the liquid that flows in the connection pipe 4725. That is, the heating liquid in the tube 474 heats the liquid in a double boiler.

In an example, a vacuum line, a suck-back valve, and the like may be provided between the heating part 470 and the nozzle 384. Accordingly, after the liquid is completely discharged from the nozzle 384, the chemical may be suctioned from a discharge end of the nozzle 384.

Figure 6:
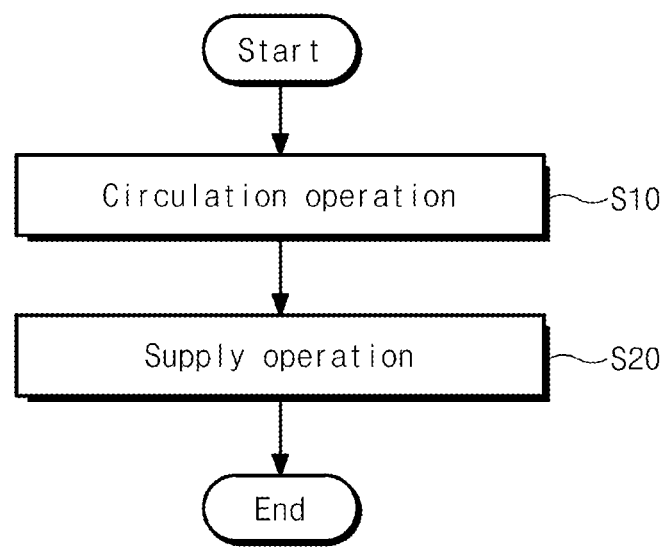
FIG. 6 is a view illustrating a flowchart of a liquid supplying method according to an embodiment of the inventive concept.
Figure 7:
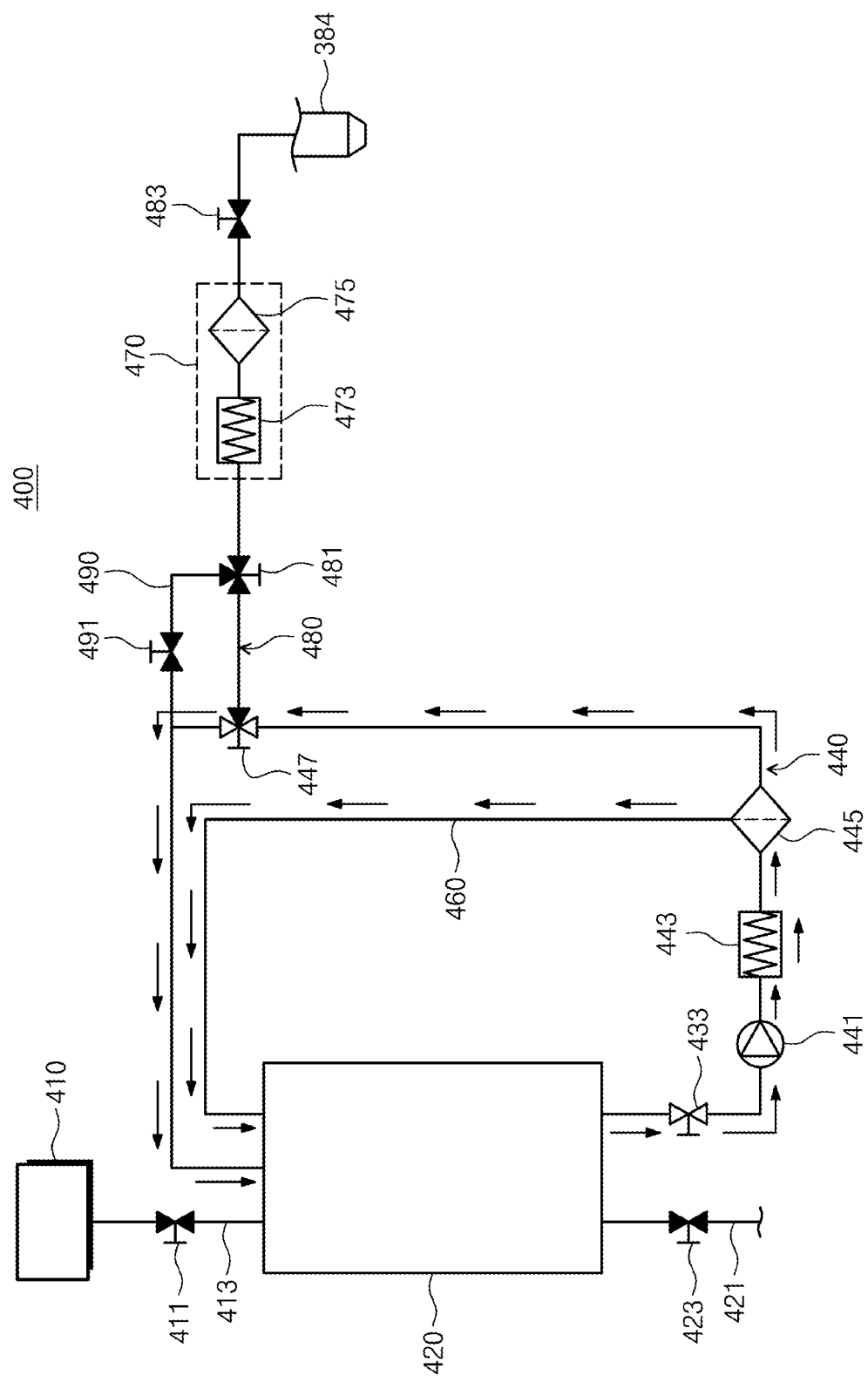
FIGS. 7 and 8 are views illustrating a liquid supplying method in sequence according to an embodiment of the inventive concept.
Figure 8:
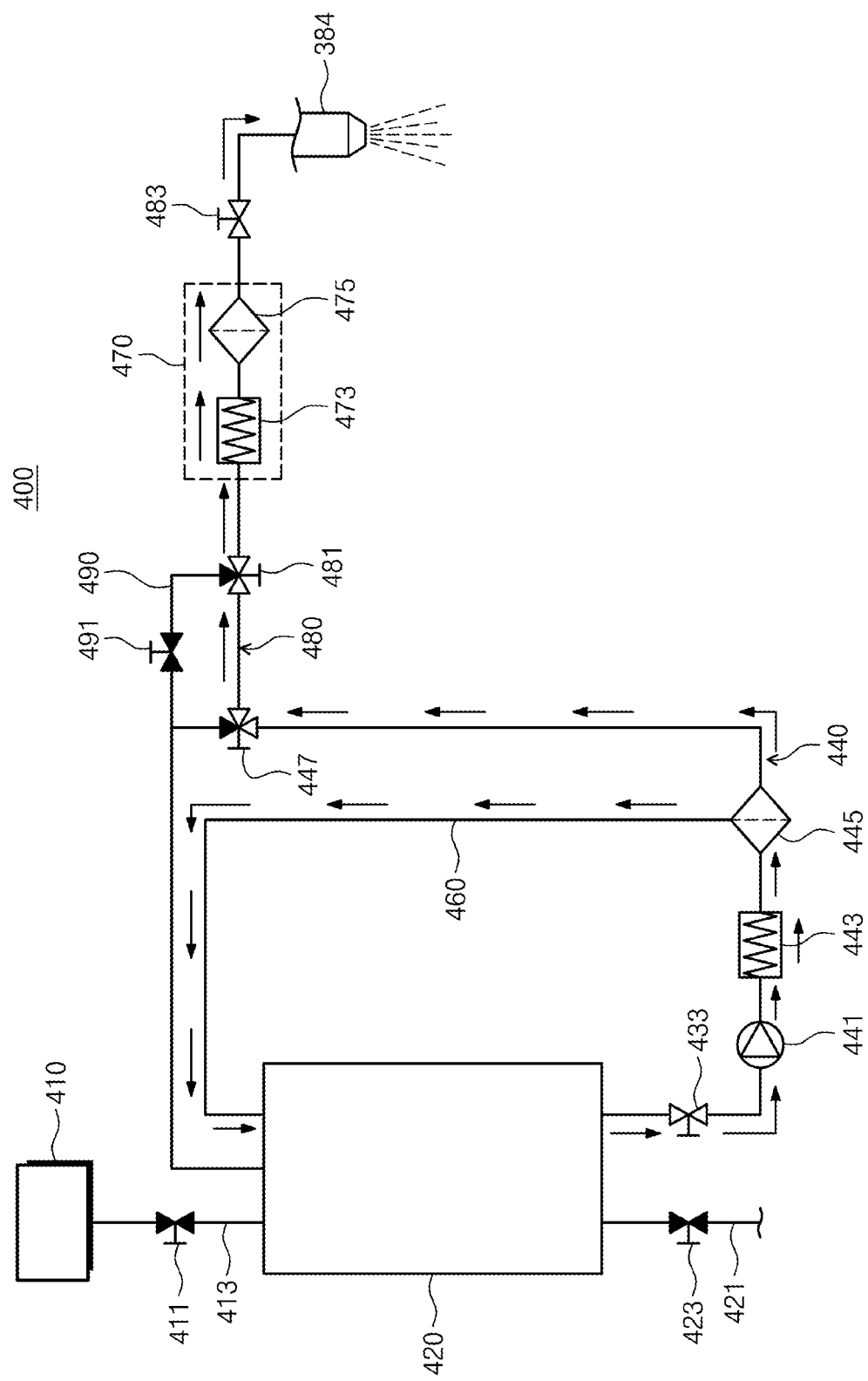

Hereinafter, a liquid supplying method of the inventive concept will be described with reference to FIGS. 6 to 8. The controller controls the liquid supply unit 400 to perform the substrate treating method of the inventive concept. FIG. 6 is a view illustrating a flowchart of a liquid supplying method according to an embodiment of the inventive concept. FIGS. 7 and 8 are views illustrating a liquid supplying method in sequence according to an embodiment of the inventive concept. The arrow indicates a flow of a fluid. The state in which the interior of the valve is filled means that the valve is closed, and the state in which the interior of the valve is empty means that the valve is opened.

Referring to FIG. 6, the liquid supplying method includes a circulation operation S10 and a supply operation S20. FIGS. 7 and 8 illustrate the circulation operation S10 and the supply operation S20, respectively. Referring to FIG. 7, in the circulation operation S10, the liquid circulates through the first circulation line 440 or the second circulation line 460 before the liquid is supplied to the nozzle 384. Then, the first heater 443 heats the liquid to a first temperature at which particles are not eluted in the interior of the liquid. The liquid is heated to the first temperature by the first heater 443 while circulating in the first circulation line 440 several times. In an example, the first temperature is a room temperature to 70° C.

If the temperature of the liquid rises to reach a specific temperature, particles are generated in the interior of the liquid supply unit 400. However, in the inventive concept, as the first heater 443 heats the liquid only to the temperature at which the particles are not eluted in the interior of the liquid, clear liquid that does not contain particles flows in the first circulation line 440 or the second circulation line 460. The supply operation S20 is started when the substrate is completely prepared to be treated, after the temperature of the liquid that flows in the first circulation line 440 reaches the first temperature.

Referring to FIG. 8, in the supply operation S20, the liquid is supplied to the nozzle 384 through the outlet line. The second heater 473 heats the liquid to the second temperature. The second temperature is a process temperature for treating the substrate with the liquid. The second temperature is higher than the first temperature. In an example, the second temperature is 70° C. to 90° C. In an example, the second heater 473 is configured to heat the heating liquid. The heating liquid is heated to a third temperature by the second heater 473. The third temperature is higher than the second temperature. In an example, the third temperature is 70° C. to 100° C. The heating liquid increases the temperature of the liquid that passes through the heating part 470 to a second temperature in a double boiler.

The liquid heated to the first temperature by the first heater 443 is heated again by the second heater 473. The second heater 473 is provided to be adjacent to the nozzle 384. Accordingly, the liquid heated by the second heater 473 flows to the nozzle 384 in a relatively short path. That is, the liquid heated to the second heater that is not less than the first temperature, at which the particles are not eluted, is provided to the nozzle 384 through a shortest path. Accordingly, the particles generated by the liquid heated to the second temperature in the pipeline 472 may be minimized.

In the above-mentioned example, it has been described that the liquid provided to the liquid supply unit is isopropyl alcohol (IPA). However, the liquid provided to the liquid supply unit may include another liquid. For example, the chemical may be an acid solution such as hydrofluoric acid, sulfuric acid, nitric acid, phosphoric acid, an alkali solution containing potassium hydroxide, sodium hydroxide, ammonium, and the like, or pure water.

In the above-mentioned example, it has been described that the second filter 475 is provided on a downstream side of the second heater 473. However, in another example, the second filter 475 may be provided in the pipeline 472 provided in the heating part 470.

In the above-mentioned example, it has been described that the first filter is provided on a downstream side of the first heater 443 and the second filter 475 is provided on a downstream side of the second heater 473. However, in another example, the first filter and the second filter 475 may not be provided.

In the above-mentioned example, it has been described that the second heater 473 heats the heating liquid that heats the pipeline 472 in a double boiler. However, unlike this, the second heater 473 may be configured to directly heat the pipeline 472. The second heater 473 may be provided in a liquid-contact structure or a non-liquid contact structure. In an embodiment, the second heater 473 may be provided with a heating wire situated between the outer surface and the inner surface of the pipeline 472. In another example, the second heater 473 may be provided with a lamp that is spaced apart from the pipeline 472 to heat the liquid in the interior of the pipeline 472.

According to the inventive concept, because the liquid is provided at the first temperature that is a standby temperature, at which particles are not eluted when the liquid circulates in the circulation line 440, particles are not generated in the circulation line 440. Accordingly, the exchange timing of the first filter may be prolonged, and the pressure loss of the liquid generated in the pipeline 472 provided in the circulation line 440 may be minimized.

Furthermore, according to the inventive concept, because the path until the liquid is supplied to the substrate after the liquid is heated to the second temperature that is a process temperature for treating the substrate is minimized, generation of the particles in the interior of the outlet line is minimized.

In addition, according to the inventive concept, because the filters are arranged on the downstream sides of the heaters, the particles generated in the interior of the heater or the particles generated in the pipeline 472 or the like by the chemical of a high temperature may be filtered out.

According to an embodiment of the inventive concept, generation of particles in the liquid supply unit may be minimized.

Furthermore, according to an embodiment of the inventive concept, the life span of the filter provided in the liquid supply unit may be increased.

In addition, according to an embodiment of the inventive concept, the pressure loss of the liquid may be minimized.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
   a housing having a treatment space for treating a substrate in an interior thereof;
   a support unit configured to support the substrate in the treatment space;
   a nozzle configured to supply a liquid to the substrate positioned on the support unit;
   a liquid supply unit configured to supply the liquid to the nozzle; and
   a controller configured to control the liquid unit,
   wherein the liquid supply unit includes:
      a tank having an interior space for storing the liquid; and
      a first circulation line configured to circulate the liquid stored in the interior space and in which a first heater is installed, and
   wherein the controller controls the first heater such that the first heater heats the liquid to a first temperature, at which particles in the interior of the liquid are not eluted,
   wherein the liquid supply unit further includes an outlet line branched from the first circulation line to supply the liquid to the nozzle,
   wherein the outlet line includes a heating part provided adjacent to the nozzle and in which a second heater is installed,
   wherein the controller controls the second heater such that the second heater heats the liquid to a second temperature, at which the liquid treats the substrate,
   wherein the second temperature is different from the first temperature,
   wherein the heating part includes:
      a pipeline, through which the liquid flows; and
      a tube surrounding the pipeline and in which a heating liquid flows in an interior thereof,
   wherein the second heater is configured to heat the heating liquid,
   wherein the pipeline includes:
      a first side part provided at one end of the heating part;
      a second side part provided at an opposite end of the heating part; and
      a plurality of connection pipes connecting the first side part and the second side part, and
   wherein diameters of the connection pipes are smaller than diameters of the first side part and the second side part.

2. The substrate treating apparatus of claim 1, wherein a first filter is installed in the first circulation line on a downstream side of the first heater to be adjacent to the first heater.

3. The substrate treating apparatus of claim 1, wherein the second temperature is higher than the first temperature.

4. The substrate treating apparatus of claim 1, wherein a second filter is installed in the heating part on a downstream side of the second heater to be adjacent to the second heater.

5. The substrate treating apparatus of claim 1, wherein the second heater is configured to heat the heating liquid to a third temperature, and the third temperature is higher than the second temperature.

6. A substrate treating apparatus comprising:

a housing having a treatment space for treating a substrate in an interior thereof;

a support unit configured to support the substrate in the treatment space;

a nozzle configured to supply a liquid to the substrate positioned on the support unit; and a liquid supply unit configured to supply the liquid to the nozzle; and a controller configured to control the liquid supply unit, wherein the liquid supply unit includes:
- a tank having an interior space for storing the liquid; and
- a first circulation line configured to circulate the liquid stored in the interior space and in which a first heater is installed; and
- an outlet line branched from the first circulation line and configured to supply the liquid to the nozzle, wherein the outlet line includes a heating part provided adjacent to the nozzle and in which a second heater is installed, wherein the controller controls the first heater and the second heater such that the first heater heats the liquid to a first temperature and the second heater heats the liquid to a second temperature, wherein the second temperature is higher than the first temperature, wherein the heating part includes:
- a pipeline, through which the liquid flows; and
- a tube surrounding the pipeline and in which a heating liquid flows in an interior thereof, wherein the second heater is configured to heat the heating liquid, wherein the pipeline includes:
- a first side part provided at one end of the heating part;
- a second side part provided at an opposite end of the heating part; and
- a plurality of connection pipes connecting the first side part and the second side part, and wherein diameters of the connection pipes are smaller than diameters of the first side part and the second side part.

7. The substrate treating apparatus of claim 6, wherein the first temperature is a room temperature to 70° C.

8. The substrate treating apparatus of claim 6, wherein the second temperature is 70° C. to 90° C.

9. The substrate treating apparatus of claim 6, wherein a first filter is installed in the outlet line on a downstream side of the first heater to be adjacent to the first heater.

10. The substrate treating apparatus of claim 6, wherein a second filter is installed in the heating part on a downstream side of the second heater to be adjacent to the second heater.

11. The substrate treating apparatus of claim 6, wherein the second heater heats the heating liquid to a third temperature, and wherein the third temperature is higher than the second temperature.

12. The substrate treating apparatus of claim 6, wherein the liquid is isopropyl alcohol (IPA).

* * * * *